United States Patent [19]
Kodama et al.

[11] Patent Number: 5,615,998
[45] Date of Patent: Apr. 1, 1997

[54] ELECTRONIC COMPONENT COOLING APPARATUS

[75] Inventors: Nobumasa Kodama; Jiro Watanabe, both of Tokyo, Japan

[73] Assignee: Sanyo Denki Co., Ltd., Tokyo, Japan

[21] Appl. No.: 500,616

[22] Filed: Jul. 11, 1995

[30] Foreign Application Priority Data

Jul. 12, 1994 [JP] Japan .................. 6-160353
Jul. 3, 1995 [JP] Japan .................. 7-167730

[51] Int. Cl.⁶ ........................................ F28F 7/00
[52] U.S. Cl. .............. 415/177; 415/213.1; 165/80.3; 361/697
[58] Field of Search .......................... 415/175, 176, 415/177, 178, 213.1; 165/80.3, 121, 122, 185; 361/695, 696, 697

[56] References Cited

U.S. PATENT DOCUMENTS

| | | |
|---|---|---|
| 5,288,203 | 2/1994 | Thomas . |
| 5,309,983 | 5/1994 | Bailey . |
| 5,421,402 | 6/1995 | Lin .................. 165/80.3 |
| 5,452,181 | 9/1995 | Hoover ............... 165/80.3 |
| 5,484,013 | 1/1996 | Morikawa et al. ..... 165/80.3 |

FOREIGN PATENT DOCUMENTS

| | | |
|---|---|---|
| 3-15982 | 4/1991 | Japan . |
| 6-339244 | 12/1994 | Japan . |
| 7-15914 | 1/1995 | Japan . |

*Primary Examiner*—James Larson
*Attorney, Agent, or Firm*—Pearne, Gordon, McCoy & Granger

[57] ABSTRACT

Electronic component cooling apparatus capable of permitting a fan to be removed from a heat sink without rotating both relatively to each other. A base section of a casing is provided at a corner thereof with a leg having an engaging section formed at a distal end thereof. The base section is also provided at another corner thereof with a terminal holder in which connection terminals are received. The terminal holder includes a terminal holding section, which is integrally provided on both sides thereof with a pair of engagement elements. The engagement elements each are provided at a distal end thereof with a hook and have an upper end formed into a length sufficient to permit it to be held by fingers. A heat sink is provided at a corner thereof with an engaged section engaged with the engaging section of the leg. The heat sink is also provided at another corner thereof with projections engaged with the hooks of the engagement elements. The upper end of each of the engagement elements is operated to release engagement between the engaging section and the engaged section.

26 Claims, 10 Drawing Sheets

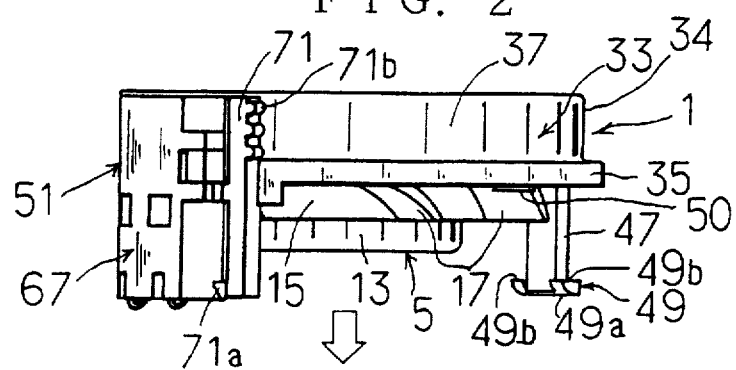
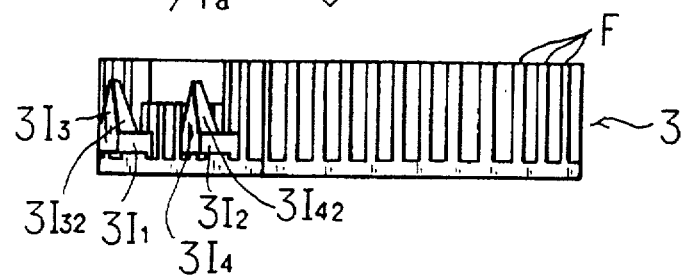
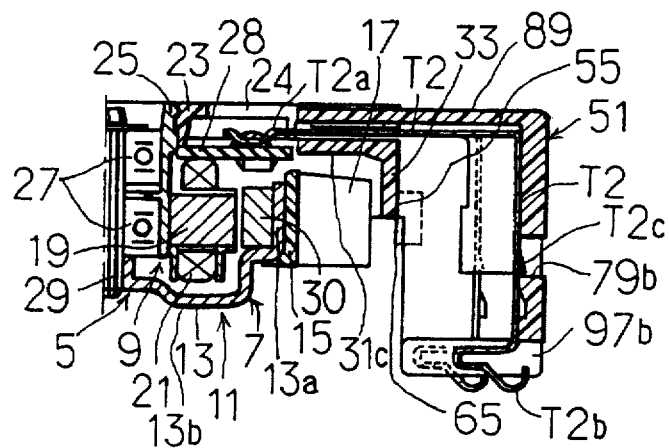
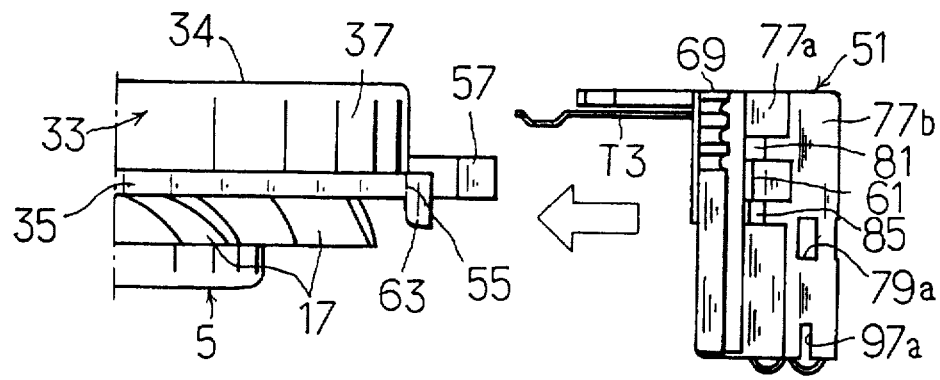

FIG. 13A
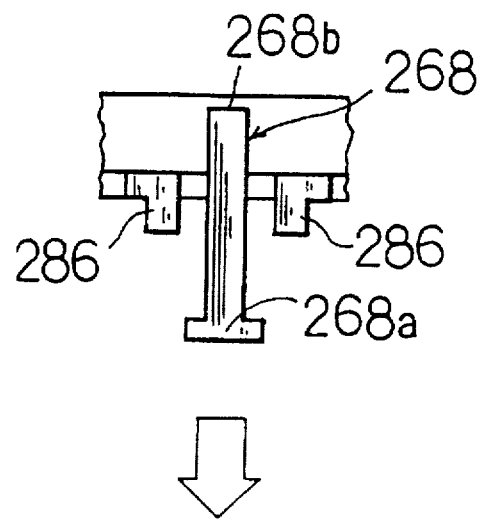
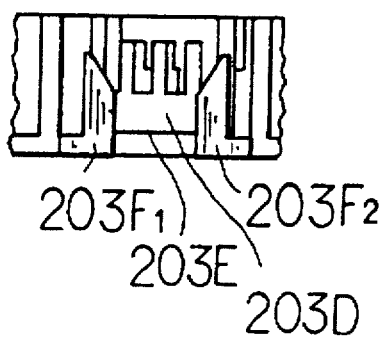
FIG. 13B
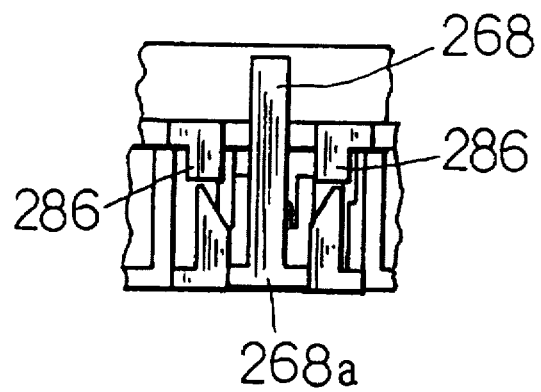

FIG. 14A
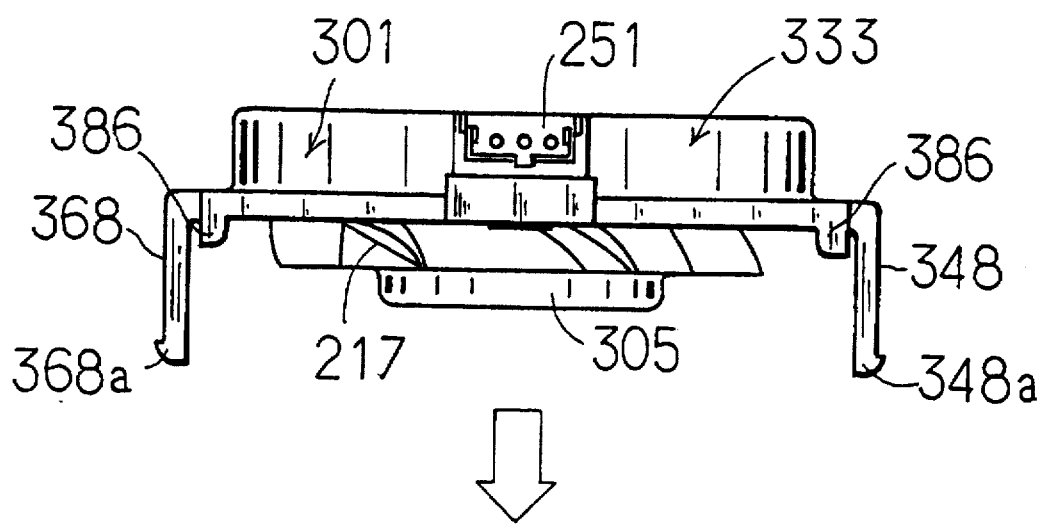
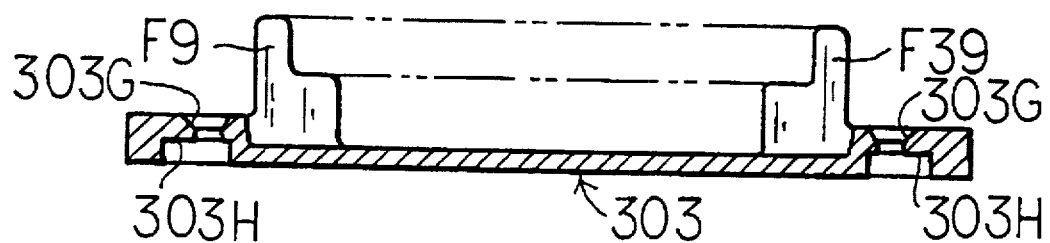
FIG. 14B
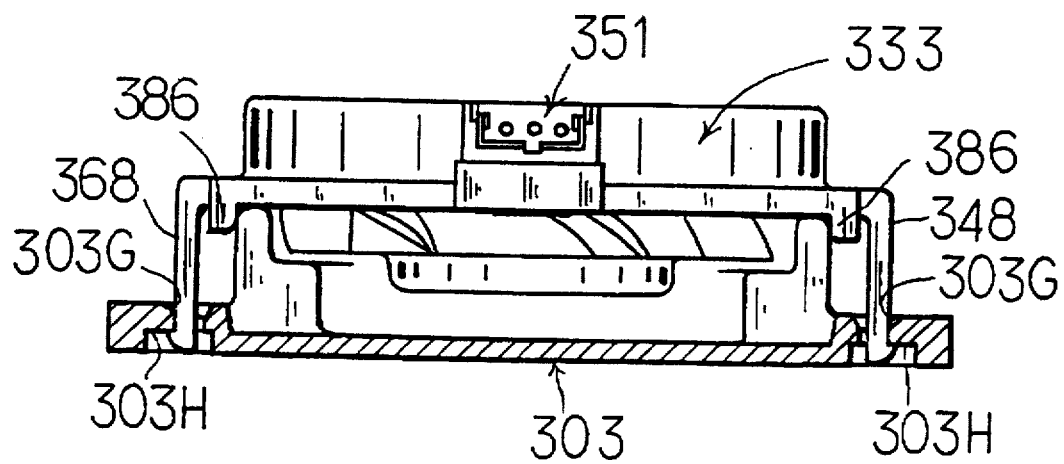

ELECTRONIC COMPONENT COOLING APPARATUS

BACKGROUND OF THE INVENTION

This invention relates to an electronic component cooling apparatus, and more particularly to an apparatus for cooling electronic components incorporated in an electronic appliance such as a microprocessor unit (MPU) or the like.

Recently, a microprocessor unit tends to be increased in integration so that performance thereof may be enhanced. Unfortunately, this causes generation of heat from the microprocessor unit to be substantially increased, so that it is required to cool the unit. In order to solve the problem, an electronic component cooling apparatus called an MPU cooler is employed for forcibly cooling the microprocessor unit per se.

Japanese Utility Model Publication No. 15982/1991 discloses an electronic component cooling apparatus, wherein a fan mounting plate is mounted on a heat sink and then an axial fan commercially available is mounted on the fan mounting plate. The axial fan commercially available is so constructed that an impeller which includes a plurality of blades and is mounted on a rotor of a motor is fully housed in a casing provided therein with a cylindrical air duct.

Also, U.S. Pat. No. 5,309,983 discloses an electronic component cooling apparatus including a heat sink formed with a fan holding recess, in which a commercially available fan is fittedly held.

U.S. Pat. No. 5,288,203 discloses an electronic component cooling apparatus, wherein a fan specially designed in such a manner that an impeller is not enclosed with a casing or the impeller is partially enclosed with or partially exposed from the casing is mounted on a heat sink. A portion of the casing exposed from the casing is received in a space defined by a plurality of radiation fins fixed on the heat sink, wherein the casing is fixed directly to the heat sink.

Direct fixing of the casing for the fan to the heat sink is carried out by adhesion techniques or by means of a plurality of fitting and/or engagement structures. The engagement structure is typically disclosed in, for example, Japanese Patent Application Laid-Open Publication No. 339244/1994 and Japanese Patent Application Laid-Open Publication No. 15914/1995. In Japanese Patent Application Laid-Open Publication No. 15914/1995, an engagement structure is disclosed wherein a casing for a fan and a heat sink are rotated relatively to each other for releasing engagement therebetween. In the structure, it is required to provide a space which permits the fan casing and heat sink to be rotated relatively to each other.

However, the prior art constructed as described above fails to permit the fan casing and heat sink to be disengaged or separated from each other after assembling of the electronic component cooling apparatus or mounting of the electronic component cooling apparatus on an electronic appliance. Even when the apparatus may be constructed to separate both from each other, it requires the above-described space for rotation. Also, relative rotation between the fan casing and the heat sink causes wearing at a contact region therebetween.

SUMMARY OF THE INVENTION

The present invention has been made in view of the foregoing disadvantage of the prior art.

Accordingly, it is an object of the present invention to provide an electronic component cooling apparatus which is capable of releasing engagement between a fan casing and a heat sink without rotating both relatively to each other.

It is another object of the present invention to provide an electronic component cooling apparatus which is capable of readily releasing engagement between a fan casing and a heat sink.

It is a further object of the present invention to provide an electronic component cooling apparatus which is capable of establishing electrical connection between an external circuit and an electric circuit for a fan without soldering.

It is still another object of the present invention to provide an electronic component cooling apparatus which is capable of mounting a fan casing on a heat sink by means of an engagement connection structure while providing the fan casing with sufficient rigidity.

Generally speaking, the present invention is directed to an improvement in an electronic component cooling apparatus which includes a fan including a motor having a rotor and a housing, an impeller having a plurality of blades and fixed on the rotor of the motor, a casing having a casing body, and a plurality of webs for interconnecting the housing of the motor and the casing, as well as a heat sink including a base and a plurality of radiation fins arranged on an upper surface of the base and connected to a lower section of the casing of the fan.

The electronic component cooling apparatus of the present invention is so constructed that the heat sink is connected to the fan casing by means of an engagement connection structure. The term "engagement connection structure" used herein indicates a structure for engaging engaged sections of the heat sink and engaging sections of the fan casing with each other without using any special mounting means such as screws, bolts or the like, to thereby interconnect the heat sink and casing. Typically, one of the engaged section and engaging section may comprise a step, a hole or the like, whereas the other may comprise a hook or the like adapted to be engaged with the step or hole. The engagement connection structure belongs to the category of so-called snap-in fitting.

The engagement connection structure may be constructed in any desired manner. However, it is preferably constructed so as to facilitate automatic assembling of the electronic component cooling apparatus. For this purpose, the assembling is preferably completed by merely linearly moving parts. More specifically, the engagement connection structure may comprise first and second engagement structures arranged opposite to each other with the fan being interposed therebetween and constructed so as to linearly move at least one of the heat sink and fan toward the other to complete connection between the heat sink and the fan.

In the present invention, at least one of the first and second engagement structures may comprise a manual engagement release structure which permits engagement between the casing and the heat sink to be manually released without rotating both relatively to each other.

The manual engagement release structure may be constructed in any desired manner so long as it permits engagement between the casing and the heat sink to be manually released without rotating both relatively to each other. In order to permit the engagement to be released with reduced force, the manual engagement release structure may comprise at least one engaging section arranged on at least one engagement element provided on the casing and at least one engaged section provided on the heat sink and engaged with the engaging section of the engagement element.

Accordingly, in accordance with the present invention, an electronic component cooling apparatus is provided, which includes a fan including a motor having a rotor and a housing, an impeller having a plurality of blades and fixed on the rotor of the motor, a casing having a casing body, and a plurality of webs for interconnecting the housing of the motor and the casing, as well as a heat sink including a base and a plurality of radiation fins arranged on an upper surface of the base and connected to a lower section of the casing of said fan.

The apparatus includes an engagement connection structure for connecting the heat sink to the casing of the fan. The engagement connection structure includes first and second engagement structures arranged opposite to each other with the fan being interposed therebetween and constructed so as to linearly move at least one of the heat sink and fan toward the other one thereof to complete connection between the heat sink and the fan. At least one of the first and second engagement structures comprises a manual engagement release structure for manually releasing engagement between the casing and the heat sink without rotating the casing and heat sink relatively to each other.

In a preferred embodiment of the present invention, the manual engagement release structure comprises at least one engaging section provided on at least one engagement element arranged on the casing and at least one engaged section formed on the heat sink and engaged with the engaging section. The engagement element is made of an insulating material exhibiting flexibility and fixed at an intermediate portion thereof to the casing body of the casing and formed into an elongate shape so as to vertically extend. The engaging section is arranged on a lower end of the engagement element and the engagement element has an upper end formed into a length sufficient to permit it to be operated by fingers.

In a preferred embodiment of the present invention, the first engagement structure is constructed so as not to manually release the engagement and the second engagement structure comprises the manual engagement release structure. The first engagement structure includes a first engaged section provided at the heat sink and a first engaging section formed at a first engagement element provided on the casing and engaged with the first engaged section. The second engagement structure includes second and third engaged sections arranged at the heat sink in a manner to extend in parallel to each other in a direction across a direction in which the first engaged section extends and second and third engaging sections arranged at second and third engagement elements provided on the casing and engaged with the second and third engaged sections while interposing the second and third engaged sections therebetween.

In a preferred embodiment of the present invention, the second and third engagement elements are formed of insulating material exhibiting flexibility. The second and third engagement elements are fixed at an intermediate portion thereof to the casing body of the casing and formed into an elongate shape so as to vertically extend. The second and third engagement elements are provided at a lower end thereof with the second and third engaging sections, respectively. The second and third engagement elements each have an upper end formed into a length sufficient to permit it to be operated by the fingers.

In a preferred embodiment of the present invention, the electronic component cooling apparatus may further comprise a plurality of spacer means arranged between the casing of the fan and the heat sink. The spacer means each upwardly bend the casing so as to downwardly project a portion of the casing corresponding to each of the first and second engagement structures and upwardly project a central portion thereof when the first and second engagement structures are kept engaged with each other. The spacer means are fixed to at least one of the casing and heat sink.

Also, in accordance with the present invention, an electronic component cooling apparatus is provided, which includes a fan including a motor of the rotor outside-rotation type having a rotor rotated outside a stator and a housing, an impeller having a plurality of blades and fixed on the rotor of the motor, a casing having a casing body and arranged so as to partially surround the impeller, and a plurality of webs for interconnecting the housing of the motor and the casing, as well as a heat sink including a base and a plurality of radiation fins arranged on an upper surface of the base and connected to a lower section of the casing of the fan. The heat sink has a first corner formed with a first engaged section in a manner to extend in a direction across a first phantom line defined so as to extend from a center of the heat sink through the first corner. Also, the heat sink has a second corner positioned opposite to the first corner and formed with second and third engaged sections in a manner to extend in a direction across a second phantom line defined so as to extend from the center of the heat sink through the second corner and be arranged on both sides of the second phantom line. The casing of the fan has a first corner provided with a first engagement element including a first engaging section engaged with the first engaged section of the heat sink. The casing of the fan also has a second corner arranged opposite to the first corner of the casing and provided with second and third engagement elements including second and third engaging sections engaged with the second and third engaged sections of the heat sink, respectively. The second and third engagement elements are formed of an insulating material exhibiting flexibility and each are fixed at an intermediate portion thereof to the casing body of the casing and formed into an elongate shape so as to vertically extend. The second and third engagement elements are provided at a lower end thereof with the second and third engaging sections, respectively, and each has an upper end formed into a length sufficient to permit it to be operated by fingers.

In a preferred embodiment of the present invention, the first engagement element includes a leg extending from the casing toward the heat sink and a projection for engagement integrally provided on a distal end of the leg and formed with the first engaging section. The first corner of the heat sink is provided with a pair of guide projections. The guide projections are arranged on both sides of the first phantom line so as to extend along the first phantom line and spaced from each other at an interval sufficient to permit the projection of the first engagement element to pass therethrough and prevent lateral movement of the projection of the first engagement element. The first engaged section comprises a step formed between the guide projections and the first engaging section is formed into a configuration which permits the first engaging section to be engaged with the step.

In a preferred embodiment of the present invention, the second corner of the heat sink is integrally provided with two engaged projections, which are arranged on both sides of the second phantom line so as to extend along the second phantom line. The engaged projections have lower end surfaces acting as the second and third engaged section, respectively.

In a preferred embodiment of the present invention, the second and third engaging sections comprise hooks integrally provided on an inner surface of the lower end of the second and third engagement elements so as to face each other, respectively. The engaged projections each are integrally provided at a free end thereof with a guide projection in a manner to upwardly project therefrom. The guide projections have inclined surfaces obliquely formed so as to be contacted with the hooks of the second and third engagement elements to gradually increase an interval between the lower ends of the second and third engagement elements, respectively.

In a preferred embodiment of the present invention, the upper end of each of the second and third engagement elements is formed into a length sufficient to permit it to be operated by fingers.

In a preferred embodiment of the present invention, the upper end of each of the second and third engagement elements is provided on an outer surface thereof with a non-slip means.

In a preferred embodiment of the present invention, the electronic component cooling apparatus further comprise a plurality of spacer means arranged between the casing of the fan and the heat sink. The spacer means each upwardly bend the casing so as to downwardly project a portion of the casing on which the first engaging section is provided and a portion thereof on which the second and third engaging sections are provided and upwardly project a region of the casing between the portions of the casing when engagement between the first engaging section and the first engaged section and engagement between the second and third engaging sections and the second and third engaged sections are maintained.

In a preferred embodiment of the present invention, the spacer means are formed integrally with the casing.

Further, in accordance with the present invention, an electronic component cooling apparatus is provided, which includes a fan including a motor having a rotor and a housing, an impeller having a plurality of blades and fixed on the rotor of the motor, a casing having a casing body and arranged so as to surround the impeller, a plurality of webs for interconnecting the housing of the motor and the casing, a circuit board received in the housing and mounted thereon with at least a part of a control circuit for controlling the motor, and a plurality of connection terminals electrically connected at one end thereof to an electrode section provided on the circuit board and at the other end thereof to an external circuit, as well as a heat sink including a base and a plurality of radiation fins arranged on an upper surface of the base and connected to a lower section of the casing of the fan. The apparatus also includes an engagement connection structure for connecting the heat sink to the casing of the fan. The engagement connection structure includes first and second engagement structures arranged opposite to each other with the fan being interposed therebetween. At least one of the first and second engagement structures comprises a manual engagement release structure for manually releasing engagement between the casing and the heat sink without rotating the casing and heat sink relatively to each other. The connection terminals are held in a terminal holder mounted on the casing body of the casing and made of an insulating resin material.

In a preferred embodiment of the present invention, the connection terminals are received in the terminal holder while being kept bent into a substantially L shape. The connection terminals each are provided at the other end thereof with a contact terminal section contacted with an electrode section of the external circuit. The contact terminal section is formed so as to project from a lower end of the terminal holder.

In a preferred embodiment of the present invention, the engagement connection structure includes a first engaged section provided at a first corner of the heat sink in a manner to extend in a direction across a first phantom line defined so as to extend from a center of the heat sink through the first corner, second and third engaged sections provided at a second corner of the heat sink opposite to the first corner in a manner to extend in a direction across a second phantom line defined so as to extend from the center of the heat sink through the second corner and be arranged on both sides of the second phantom line, a first engaging section provided on a first engagement element arranged at a first corner of the casing of the fan and engaged with the first engaged section of the heat sink, and second and third engaging sections provided on second and third engagement elements arranged at a second corner of the casing opposite to the first corner of the casing and engaged with the second and third engaged sections of the heat sink, respectively. The second and third engagement elements are formed of a material exhibiting flexibility, and each are fixed at an intermediate portion thereof to the casing body of the casing and formed into an elongate shape so as to vertically extend. Also, the second and third engagement elements are provided at a lower end thereof with the second and third engaging sections, respectively, and each have an upper end formed into a length sufficient to permit it to be operated by fingers.

In a preferred embodiment of the present invention, the terminal holder includes a terminal holding section for holding the connection terminals. The first and second engagement elements are integrally formed on the terminal holder in a manner to be positioned on both sides of the terminal holding section.

In a preferred embodiment of the present invention, the terminal holding section of the terminal holder is hollow and formed on a first side facing the casing body with a terminal inserting opening. The terminal holding section is formed on a second side thereof opposite to the terminal inserting hole with a plurality of windows for confirmation in a manner to positionally correspond to the connection terminals. The connection terminals each are formed with a projection fitted in the window corresponding thereto.

In a preferred embodiment of the present invention, the terminal holding section is formed on a lower portion thereof with a plurality of slits in each of which the contact terminal section of each of the connection terminals is movably fitted while being exposed.

In a preferred embodiment of the present invention, the first and second engagement structures each comprise a manual engagement release structure and each include an engaging section provided on an engagement element arranged on the casing and an engaged section formed on the heat sink and engaged with the engaging section of the engagement element.

In a preferred embodiment of the present invention, the engagement element is formed of an insulating material exhibiting flexibility and fixed at an intermediate portion thereof to the casing body of the casing and formed into an elongate shape so as to vertically extend. The engaging section is arranged on a lower end of the engagement element and the engagement element has an upper end formed into a length sufficient to permit it to be operated by the fingers.

In a preferred embodiment of the present invention, the engaged section of the first engagement structure is provided at a first corner of the heat sink in a manner to extend in a direction across a first phantom line defined so as to extend from a center of the heat sink through the first corner. The engaged section of the second engagement structure is provided at a second corner of the heat sink opposite to the first corner in a manner to extend in a direction across a second phantom line defined so as to extend from the center of the heat sink through the second corner and be arranged on either side of the second phantom line.

In a preferred embodiment of the present invention, the corners of the heat sink each are provided with a pair of guide projections. The guide projections are arranged on both sides of the phantom line corresponding to each of the corners in a manner to extend along the phantom line. The guide projections are spaced from each other at an interval sufficient to permit the engaging section of the engagement element to pass therethrough and prevent lateral movement of the engaging section.

In a preferred embodiment of the present invention, the engaged section comprises a step formed between the guide projections. The engaging section is formed into a configuration which permits the engaging section to be engaged with the step.

In a preferred embodiment of the present invention, the casing includes a cylindrical section for surrounding the impeller and a base section provided on one end of the cylindrical section and contacted with an upper end of the radiation fins. The base section of the casing is integrally provided on both sides of a portion thereof on which the engagement elements of the first and second engagement structures are mounted with a pair of contact elements contacted with an outer end surface of the radiation fins.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein:

FIG. 2 is an exploded front elevation view showing coupling of a fan to a heat sink;

FIG. 4 is a sectional view showing mounting of an terminal holder in the electronic component cooling apparatus of FIG. 1;

FIG. 5 is an exploded view showing mounting of a terminal holder;

FIG. 13A is a fragmentary exploded view showing a procedure for engagement between a second engaging section and a second engaged section;

FIG. 13B is a fragmentary enlarged view showing engagement between a second section and a second engaged section;

FIG. 14A is an exploded sectional view showing still another embodiment of an electronic component cooling apparatus according to the present invention; and FIG. 14B is a side elevation view partly in section of the electronic component cooling apparatus shown in FIG. 14A.

DETAILED DESCRIPTION OF THE PREFERRED EMBODIMENTS

Figure 1A:
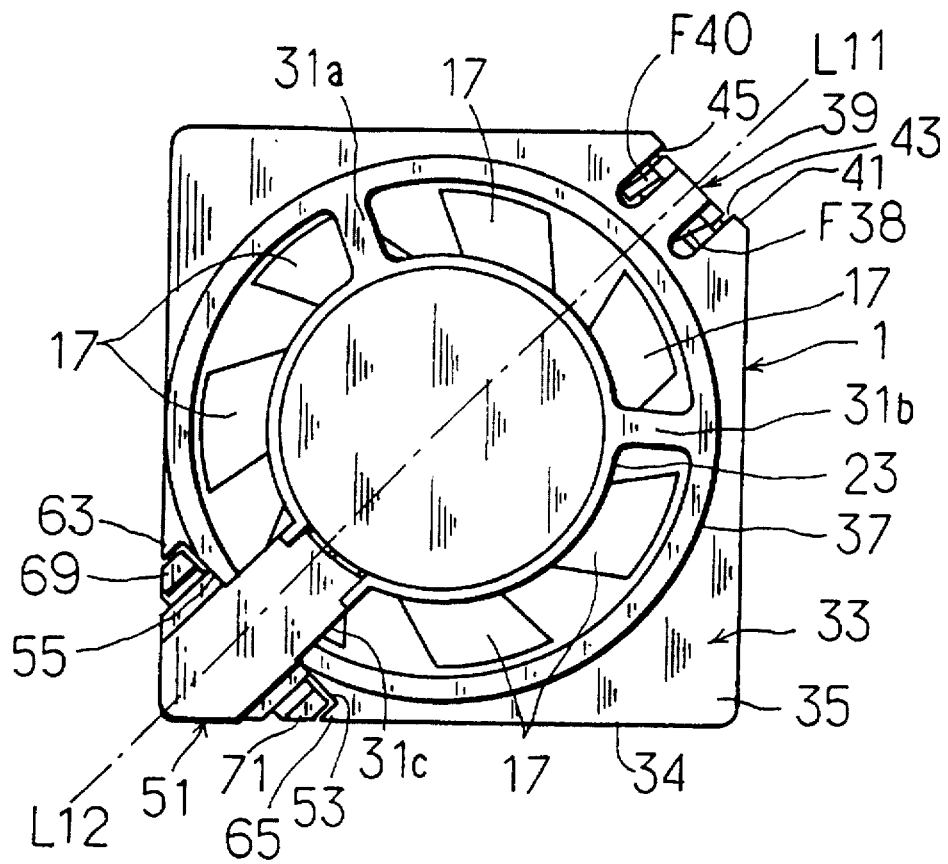
FIG. 1A is a plan view showing an embodiment of an electronic component cooling apparatus according to the present invention.

Now, an electronic component cooling apparatus according to the present invention will be described hereinafter with reference to the accompanying drawings.

Referring first to FIGS. 1A to 4, an embodiment of an electronic component cooling apparatus according to the present invention is illustrated. An electronic component cooling apparatus of the illustrated embodiment, as shown in FIG. 4, includes a fan 1, which is in the form of an axial air fan including a motor of the rotor outside-rotation type having a rotor 7 rotated outside a stator 9, which is designated by reference numeral 5. In the illustrated embodiment, a two-phase brushless DC motor is used as the motor 5. A DC brushless motor is generally used as the motor 5, however, any other suitable motor may be conveniently used for this purpose. It is most preferable that the fan 1 in which such a motor is incorporated is an axial fan.

Reference numeral 11 designates an impeller, which includes an annular member 15 made of a synthetic resin material and fitted on a peripheral wall 13a of a cup-like member 13 made of a metal material, as well as seven blades 17 provided on an outer periphery of the annular member 15. The motor 5 includes the stator 9 constituted by an iron core 19 and an exciting coil 21 wound on the core 19. The core 19 is fixed on a bearing holder 25 made of metal and fitted in a central portion of a housing 23 made of synthetic resin. The bearing holder 25 has a pair of bearings 27 housed therein in a manner to be spaced from each other in an axial direction thereof. A revolving shaft 29 is rotatably supported by the bearings 27 and fitted at one end thereof in a hole formed on a bottom wall 13b of the cup-like member 13.

The housing 23 is securely mounted therein with a circuit board 28 on which electronic parts or components constituting a driving circuit are mounted. The peripheral wall 13a of the cup-like member 13 is securely mounted on an inner surface thereof with a plurality of magnetic poles 30 each comprising a permanent magnet.

The housing 23 of the motor 5 is connected through three webs 31a to 31c (FIG. 1) to a casing 33. In the illustrated embodiment, the housing 23, webs 31a to 31c and casing 33 are formed of synthetic resin such as polybutylene terephthalate in a manner to be integral with each other. The webs 31a to 31b are arranged at angular intervals of about 120 degrees. The web 31c is constructed so as to guide a part of connection terminals and permit a terminal holder to be partially fitted therein, as described hereinafter.

In the illustrated embodiment, the blades 17 of the impeller 11 each are constructed so as to permit air to be introduced from a side of the webs 31a to 31c by suction and then flowed through passages defined between a plurality of radiation fins F1–F60 provided on a base 3A (FIG. 3) of a heat sink 3. Thus, the blades 17 of the impeller 11 act to forcibly radially flow air while serving as an axial fan.

The casing 33, as shown in FIG. 1A, includes a casing body 34, which includes a base section 35 formed into substantially the same configuration as the base of the heat sink 3 and contacted with the radiation fins F 1 to F60, as well as a cylindrical section 37 connected at one end thereof to the base section 35 and arranged so as to surround a part of the impeller 11. The base section 35 of the casing body 34, as indicated at reference numeral 41 in FIG. 1A, is cut out at an outer periphery thereof or one corner 39 thereof in a direction across a phantom line L11 defined so as to extend through a center C of the fan 1 or motor 5 to the corner 39. The corner 39 thus cut out is formed with two slits 43 and 45 in a manner to be positioned on both sides of the phantom line L11 and extend along the phantom line. In the illustrated embodiment, the slits 43 and 45 are arranged so as to be parallel to each other. The corner 39 is provided on a portion thereof interposed between the slits 43 and 45 with a leg 47 (FIG. 2) in a manner to downwardly extend therefrom toward the heat sink 3. The slits 43 and 45 function to provide the leg 47 with flexibility or elasticity of a suitable magnitude. The casing body 34 is integrally formed of synthetic resin which exhibits increased hardness and/or rigidity when it is cured, to thereby permit assembling of the casing body 34 to be carried out with increased accuracy. The leg 47 is provided at a distal end thereof with a projection 49 for engagement in a manner to be integral with the leg. The projection 49 is formed so as to project on both sides of the leg 47 in a direction of width thereof and has a curved lower surface. Also, the projection 49 has an upper end surface 49b flatly formed. The flat end surface 49b constitutes a first engaging section for a first engagement structure. Also, in the illustrated embodiment, the leg 47 and projection 49 cooperate with each other to provide a first engagement element.

Now, the heat sink 3 will be described hereinafter with reference to FIGS. 3A to 3C for the purpose of describing a first engaged section which is adapted to be engaged with the first engaging section.

Figure 3A:
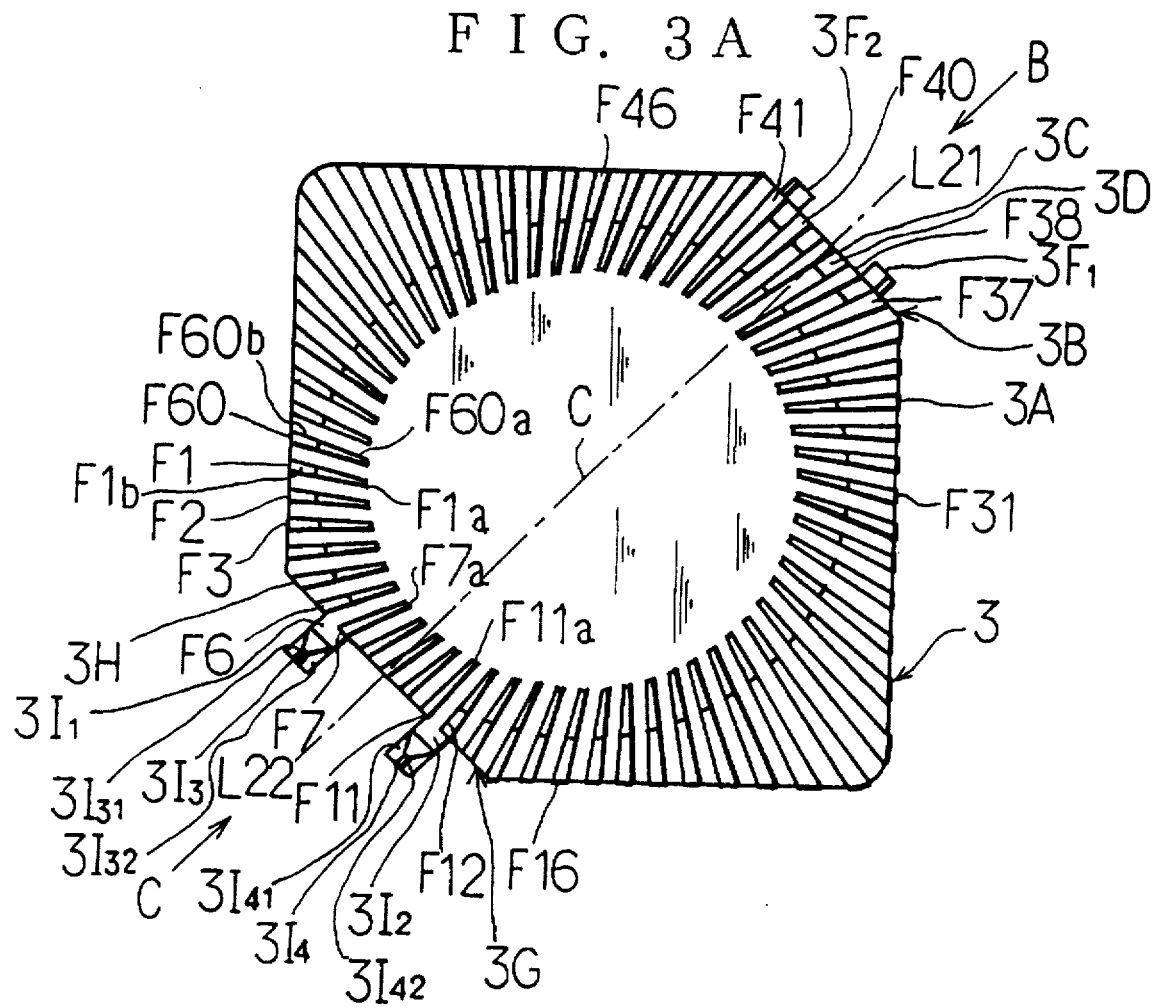
FIG. 3A is a plan view showing a heat sink.
Figure 3B:
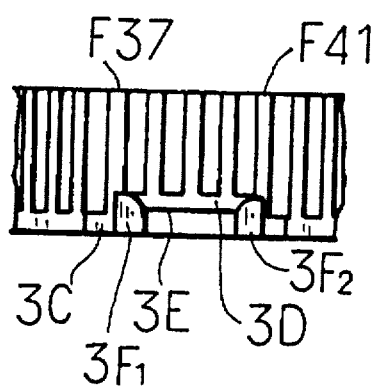
FIG. 3B is a view taken along an arrow B in FIG. 3A.
Figure 3C:
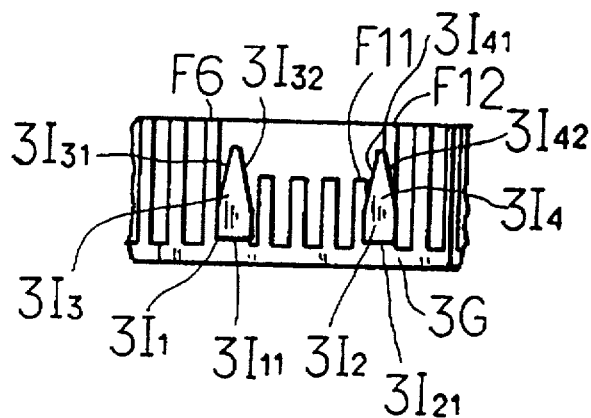
FIG. 3C is a view taken along an arrow C in FIG. 3A.

In the illustrated embodiment, the heat sink 3, as indicated at reference character 3C in FIG. 3A, has a corner 3B positioned on a diagonal line thereof, which corner is cut out in a direction perpendicular to a phantom line L21 extending between the corner 3B and the center C of the heat sink 3 aligned with an axis of the motor 5. The corner 3B thus cut out is formed with a rising portion 3D upwardly extending, resulting in a step 3E being formed at a lower portion of the corner 3B. The step 3E thus defined below the rising portion 3D is engaged with the first engaging section constituted by the flat end surface 49b described above. More particularly, the step 3E constitutes a first engaged section extending in a direction perpendicular to the phantom line L21. Also, the corner 3B cut out is provided with a pair of guide projections 3F1 and 3F2. The guide projections 3F1 and 3F2 are arranged so as to interpose the rising portion 3D therebetween and extend in parallel to the phantom line L21. The guide projections 3F1 and 3F2 are spaced from each other at an interval sufficient to permit the projection 49 of the leg 47 extending from the casing 33 to pass therethrough and prevent lateral movement of the projection 49. The guide projections 3F1 and 3F2 have an upper surface inwardly curved so as to function as a tapered surface for guide. The projection 49 for engagement is permitted to be inserted between the guide projections 3F1 and 3F2 from both an upper side of the projections and a front side thereof.

The base section 35 of the casing body 34, as shown in FIG. 2, is integrally formed on a lower surface thereof with a plurality of plate-like projections 50. The projections 50 function as spacer means for forming a space between the casing body 34 and the heat sink 3. The projections 50 are located between the fan casing 33 and the heat sink 3 and provided in a manner to permit the casing 33 to be upwardly bent so that a portion of the casing corresponding to the first and second engagement structures is downwardly projected to render a portion therebetween upwardly convex or projected when the casing 33 and heat sink 3 are combined with each other to engage the first and second engagement structures with each other. In the illustrated embodiment, the portion of the casing corresponding to the first and second engagement structures includes first to third engaging sections 49b, 69a and 71a provided at first to third engagement elements of the casing 33, respectively. When the casing 33 is thus upwardly bent, the first to third engaging sections 49b, 69a and 71a which will be detailedly described hereinafter are upwardly pulled, so that engagement between the first engagement structure and the second engagement structure may be strengthened. In the illustrated embodiment, the spacer means 50 are arranged on the base sections 35 in a manner to be spaced from each other at substantially equal intervals around the cylindrical section 37 of the casing 33. The plural spacer means 50 are preferably fixed to at least one of the casing and heat sink. In particular, integral formation of the spacer means and casing permits the spacer means to be readily provided without increasing the number of parts. In the illustrated embodiment, the projections 50 constituting the spacer means are provided integrally with the casing 33. Alternatively, the spacer means 50 each may be formed of a tape, which may be applied to the casing 33 by means of an adhesive or the like. The spacer means 50 may be arranged on the heat sink 3. For this purpose, a part of the radiation fins may be arranged so as to upwardly project from the remaining radiation fins.

Also, the heat sink 3, as indicated at reference character 3H in FIG. 3A, is cut out at a corner 3G positioned opposite to the corner 3B on the diagonal line thereof in a direction perpendicular to a phantom line L22 outwardly extending from the center C of the heat sink 3 through the corner 3G. The heat sink 3, as shown in FIG. 3A, is integrally provided on a surface thereof adjacent to the corner 3G with two engaged projections 311 and 312 in a manner to be positioned on both sides of the phantom line L22 and extend in parallel thereto. The engaged projections 311 and 312 thus provided have lower edges or end surfaces 3I11 and 3I12 which constitute second and third engaged sections of the second engagement structure, respectively. The engaged projections 311 and 312 have free ends integrally provided with guide projections 313 and 314 upwardly extending therefrom, respectively. The guide projections 313 and 314 are formed on both sides thereof defined in a direction of width thereof with inclined surfaces 3131, 3132 and 3141, 3142, which are inclined so as to upwardly approach each other. The inclined surfaces will be further described hereinafter.

The radiation fins F1 to F60, as shown in FIG. 3, are arranged on a surface of the heat sink 3. The radiation fins other than those F7 to F11 include first sections F1a to F60a arranged opposite to a lower end of the blades 17 and second sections F1b to F60b positioned on an outer side of the blades 17 defined in a radial direction thereof, respectively. The radiation fins F7 to F11 include first sections F7a to F11a extending to the outer side of the blades 17. The radiation fins each are gradually decreased in thickness toward an inner side of the blades.

Figure 1B:
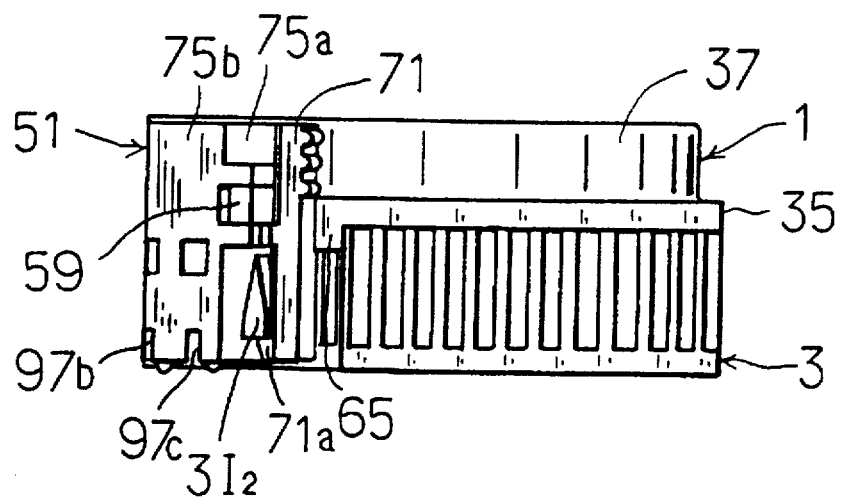
FIG. 1B is a front elevation view of the electronic component cooling apparatus shown in FIG. 1A.
Figure 6:
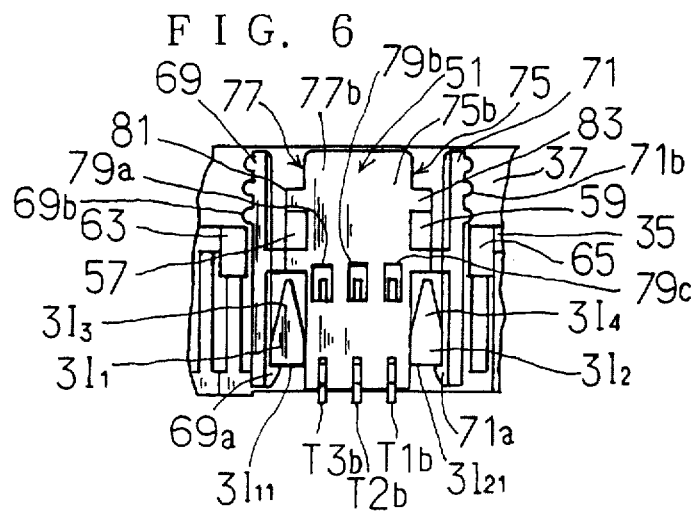
FIG. 6 is a fragmentary enlarged view showing an essential part of a second engagement structure in the electronic component cooling apparatus of FIG. 1.

The casing 33 is constructed by cooperation of the casing body 34 of the fan 1 with a terminal holder 51 mounted on the casing body 34. The terminal holder 51, as shown in FIG. 1, is mounted at another corner 53 of the base section 35 opposite to the corner 39 on a diagonal line of the casing 33. The corner 53, as indicated at reference numeral 55 in FIGS. 4 and 5, is cut out in a direction across or perpendicular to a phantom line L12 defined so as to extend from the center of the motor 5 through the corner 53. Reference numerals 57 and 59 each designate a holding element arranged so as to laterally extend from a boundary between the corner 53 thus cut out and the cylindrical section 37 of the casing 33 while being spaced from each other at a predetermined interval as shown in FIGS. 1B, 5 and 6. The holding elements 57 and 59 for mounting are arranged on both sides of the phantom line L12 so as to extend in parallel thereto. The holding elements 57 and 59 each are formed on an inner side thereof with a hook, which is engaged with each of a pair of steps 61 (FIG. 5) provided on an outer surface of the terminal holder 51. Engagement of the hook of each of the holding elements 57 and 59 with the step 61 of the terminal holder 51 prevents the terminal holder 51 from being released from the the casing 33. The corner 53 of the base section 35 of the casing body 34 which is cut out as indicated at reference numeral 55, as shown in FIG. 1A, is integrally provided on both sides thereof with two projections 63 and 65 for positioning the terminal holder 51.

Figure 7A:
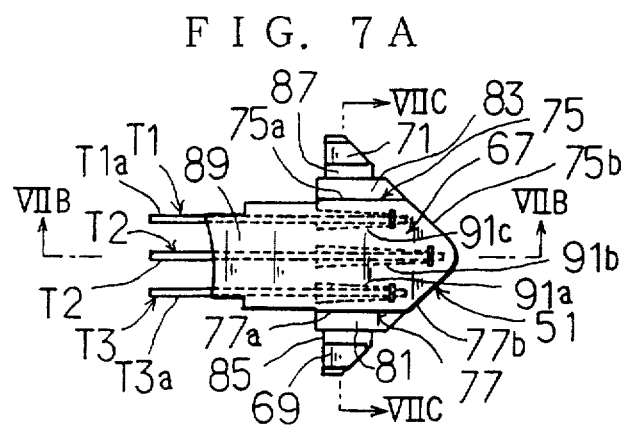
FIG. 7A is a plan view showing a terminal holder.
Figure 7B:
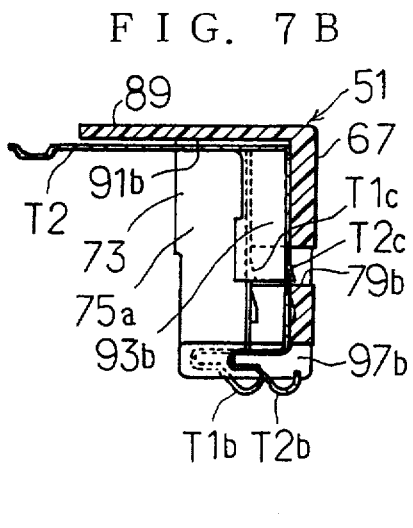
FIG. 7B is a sectional view taken along like VIIB—VIIB of FIG. 7A.
Figure 7C:
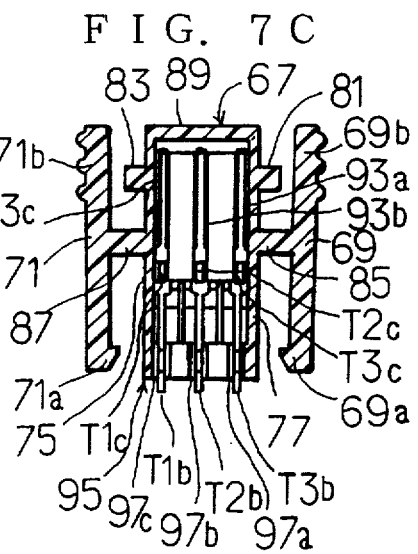
FIG. 7C is a sectional view taken along like VIIC—VIIC of FIG. 7A.
Figure 8A:
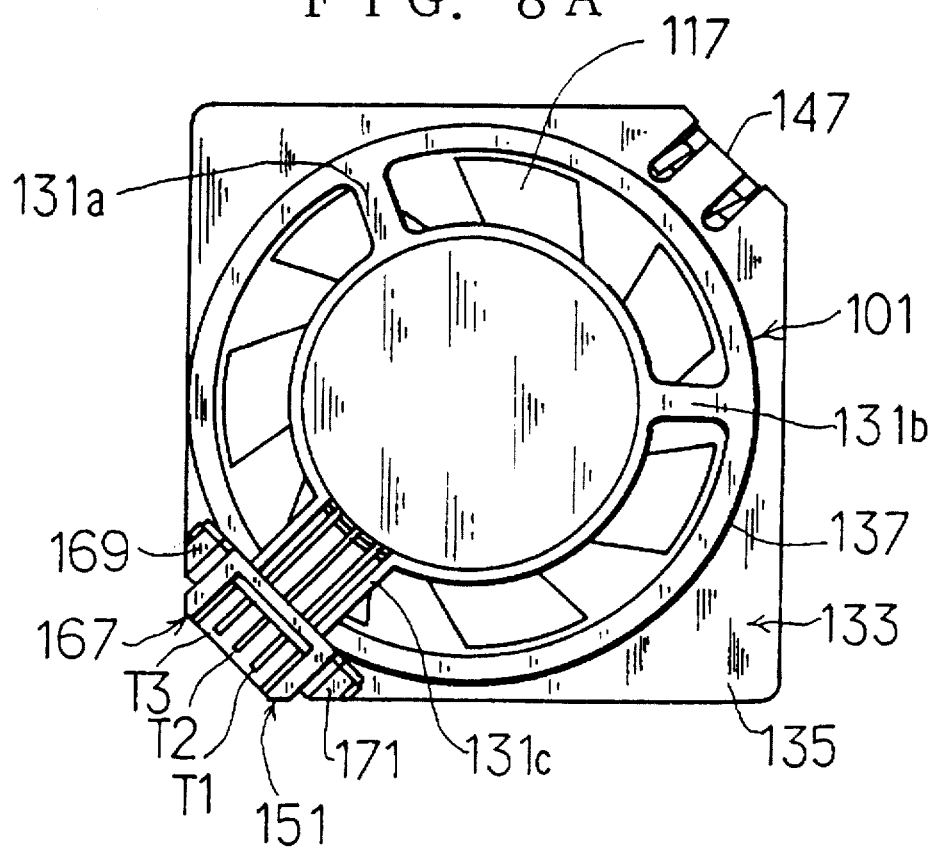
FIG. 8A is a plan view showing another embodiment of an electronic component cooling apparatus according to the present invention.
Figure 8B:
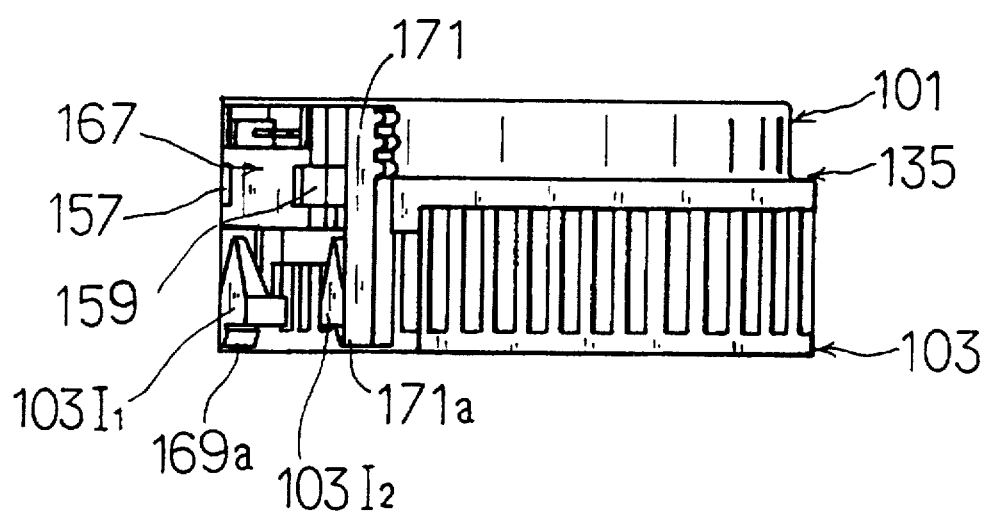
FIG. 8B is a front elevation view of the electronic component cooling apparatus shown in FIG. 8A.
Figure 9:
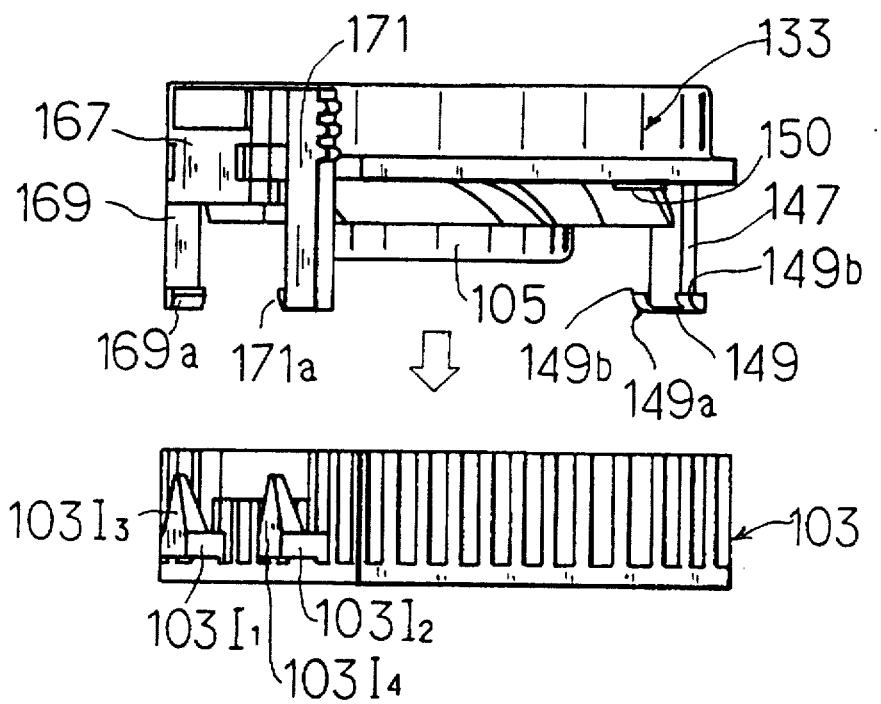
FIG. 9 is an exploded front elevation view showing coupling of a fan to a heat sink.
Figure 10:
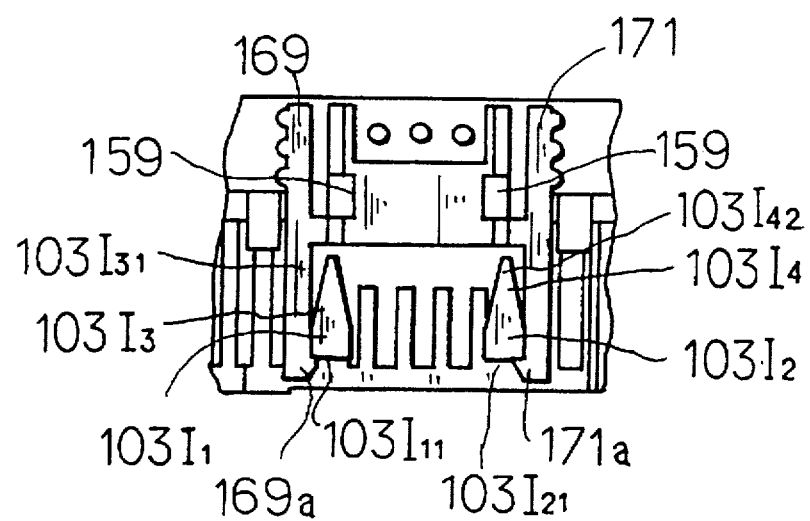
FIG. 10 is a fragmentary enlarged view showing an essential part of a second engagement structure in the electronic component cooling apparatus of FIG. 8.

The terminal holder 51, as shown in FIGS. 7A to 7C, includes a terminal holding section 67, and second and third holding elements 69 and 71 integrally provided on both sides of the terminal holding section 67. The terminal holding section 67 is hollow and formed on a portion thereof facing the casing body 34 with a terminal inserting opening 73 (FIG. 7B). The terminal holding section 67 includes side walls 75 and 77 which are constituted by rear wall sections 75a and 77a (FIG. 7A) arranged in parallel to each other and front wall sections 75b and 77b forwardly intersecting each other, respectively. The front wall sections 75b and 77b are formed with three windows 79a to 79c for confirmation in a manner to positionally correspond to three connection terminals T1 to T3. Also, the side walls 75 and 77 are integrally provided on an outer surface thereof with a pair of projections 81 and 83, which function to provide a guide passage for guiding the holding elements 57 and 59 between connection sections 85 and 87 for connecting intermediate portions of the second and third engagement elements 69 and 71 to the terminal holding section 67. The projections 81 and 83 in a pair, as best seen in FIG. 7C, are arranged so as to forwardly extend along the rear wall sections 75a and 77a of the side walls 75 and 77.

The terminal holding section 67 also includes an upper wall section 89 arranged so as to rearwardly extend, which is so formed that a part thereof closes an opening of the web 31c in which the connection terminals T1 to T3 are partially received. The upper wall section 89 is formed on an inner surface thereof with fit grooves 91a to 91c in which the connection terminals T1 to T3 are fitted. Likewise, the front wall sections 75b and 77b of the side walls 75 and 77 are formed on an inner surface thereof with fit grooves 93a to 93c, which are arranged so as to be contiguous to the fit grooves 91a to 91c and in which the connection terminals T1 to T3 are likewise fitted. The connection terminals are tightly fitted in the fit grooves 91a to 93c, resulting in release of the connection terminals from the fit grooves being effectively prevented.

The three connection terminals T1 to T3 each are received in the terminal holder 51 while being bent into a substantially dog-legged or L shape. The connection terminals T1 to T3 have one ends T1a to T3a formed so as to downwardly project, to thereby facilitate soldering of the terminals to an electrode section formed on the circuit board 28, respectively. Also, the terminals T1 to T3 have the other ends T1b to T3b each formed with a contact terminal section contacted with an electrode section of an external circuit, respectively. The external circuit includes electrodes and the like which are formed on the circuit board on which the electronic component cooling apparatus is mounted. The contact terminal sections formed on the other ends T1b to T3b of the connection terminals each are arranged so as to project from a lower end surface of the terminal holder 51. The terminal holding section 67 also includes a lower wall 95, which is formed with a plurality of slits 97a to 97c in which the contact terminal sections of the other ends T1b to T3b of the connection terminals are movably fitted while being exposed. The connection terminals T1 to T3 are formed with projections T1c to T3c (FIG. 7C) which are fitted in the windows 79a to 79c, respectively. The the projections T1c to T3c are observed through the windows 79a to 79c for confirmation, resulting in arrangement of the connection terminals T1 to T3 in place being confirmed.

The engagement elements 69 and 71 arranged on both sides of the terminal holding section 67 of the terminal holder 51 so as to function as the second and third engagement elements, as described above, are connected at the intermediate portion thereof to the terminal holding section 67 through the connection sections 85 and 87, respectively. The second and third engagement elements 69 and 71 each are formed into an elongate shape and arranged so as to vertically extend. The engagement elements 69 and 71 are integrally provided at a lower end thereof with hooks 69a and 71a constituting second and third engaging sections, respectively. Also, the engagement elements 69 and 71 have upper ends 69b and 71b formed into a length sufficient to permit it to be operated by fingers. The upper ends 69b and 71b each are provided on an outer surface thereof with roughness acting as a non-slip means. In FIG. 6, when the upper ends 69b and 71b are held by two fingers, resulting in being approached to each other, the engagement elements 69 and 71 are pivotally moved about the connection sections 85 and 87, so that the hooks 69a and 71a are outwardly expanded, to thereby be released from engagement therebetween.

The hooks 69a and 71a are arranged so as to face each other. Thus, the hooks 69a and 71a are arranged so as to project toward the terminal holding section 67. The hooks 69a and 71a constituting the second and third engaging sections are engaged with lower edges or end surfaces 3111 and 3112 (second and third engaged sections) of engaged projections 311 and 312 shown in FIGS. 3A to 3C and 6. In the illustrated embodiment, the lower end surfaces 3111 and 3121 (second and third engaged sections) of the engaged projections 311 and 312 of the heat sink 3 and the hooks 69a and 69b of the engagement elements 69 and 71 (second and third engagement elements) cooperate with each other to provide a second engagement structure. The second engagement structure thus provided acts as a manual engagement release structure which releases engagement between the casing 33 and the heat sink 3 by a manual operation Without rotating the casing 33 and heat sink 1 relatively to each other.

An essential function of the terminal holder 51 is to hold the terminals, therefore, it is not required to exhibit such rigidity as required for the casing body of the casing. Thus, the terminal holder may be made of any suitable resin exhibiting some flexibility after it is cured.

When the electrodes of the external circuit are placed in proximity to a mounting surface of the electronic component cooling apparatus, the terminal holder constructed as described above permits the contact terminal sections of the connection terminals to be electrically connected to the electrodes of the external circuit concurrently with mounting of the electronic component cooling apparatus. This results in automatic assembling of an electronic appliance being facilitated. Also, the terminal holder incorporated in the illustrated embodiment permits the projections of the connection terminals to be observed through the confirmation windows, so that mounting of the connection terminals may be visually confirmed. Also, the illustrated embodiment may be so constructed that the terminal holding sections of the terminal holder each are fitted at a lower end thereof between the above-described two engaged projections. Such construction, even the above-described first and second engagement elements provided on each of the terminal holding sections are deformed, permits the assembling to be readily automatically carried out without causing lateral movement of the casing.

For assembling of the electronic component cooling apparatus, first of all, the terminal holder is mounted on the casing body 34 of the casing 33, as shown in FIG. 5. Then, as shown in FIG. 4, one end of each of the connection terminals T1 to T3 is connected to the electrode of the circuit board 28 by soldering through an electrode exposing window 24 formed at the housing 23 of the motor by means of an automatic soldering machine. An inexpensive automatic soldering machine commercially available is typically constructed so as to carry out the assembling while linearly moving parts. Assembling of the apparatus by means of such an automatic assembling machine (not shown), as shown in FIG. 2, is carried out in a manner to locate the heat sink 3 at a lower position, clamp the fan 1 by means of the automatic assembling machine and vertically downwardly move the fan 1 toward the heat sink 3. This causes the projection 49 for engagement provided at the distal end of the leg 47 which constitutes the first engagement element to enter between the guide projections 3F1 and 3F2 (FIG. 3B). Then, after the leg 47 is outwardly deflected or bent in a slight amount, the projection 49 for engagement is moved into under the rising portion 3D (FIG. 3B) to engage the end surface 49b of the projection 49 with the step 3E of the rising portion 3D, resulting in an engaging operation of the first engagement structure being completed.

An engaging operation of the second engagement structure is carried out concurrently with that of the first engagement structure. More particularly, the hooks 69a and 71a of the holding elements 69 and 71 provided on the terminal holder 51 are moved along the inclined surfaces 3131 and 3142 (FIGS. 3A and 3C) of the guide projections 313 and 314 arranged at the corner 3G of the heat sink 3. Then, the fan 1 is downwardly moved toward the heat sink 3, so that the holding elements 69 and 71 are outwardly expanded depending on expansion of the inclined surfaces 3131 and 3142. This results in an interval between the hooks 69a and 71a being increased. Then, when the fan 1 is further lowered toward the heat sink 3, the hooks 69a and 71a are moved beyond the engaged projections 311 and 312, to thereby engage the hooks 69a and 71a with the lower end surfaces 3111 and 3121 of the engaged projections 311 and 312. This results in the engaging operation of the second engagement structures being completed. Thus, it will be noted that the engaging operations of the first and second engagement structures can be accomplished by merely linearly moving the fan 1 toward the heat sink 3, therefore, the apparatus of the illustrated embodiment may be readily assembled by means of a conventional automatic assembling machine.

When any failure or trouble occurs in the fan 1 after the electronic component cooling apparatus is mounted on the electronic appliance, the upper ends 69b and 71b of the engagement elements 69 and 71 are held between the thumb and the forefinger to outwardly expand the lower ends of the engagement elements 69 and 71, so that the hooks 69a and 71a (second and third engaging sections) of the engagement elements 69 and 71 are readily released from engagement with the lower end surfaces 3111 and 3121 (second and third engaged sections) of the engaged projections 311 and 312. Then, when the engagement elements 69 and 71 are lifted while being kept somewhat inclined after the disengagement, engagement of the first engagement structure is concurrently released. Thus, it will be noted that the illustrated embodiment permits the fan 1 to be removed from the heat sink 3 without rotating the fan 1. This prevents wear and deformation of contacts of the connection terminals T1 to T3 while eliminating a necessity of providing a fan rotating space around the electronic component cooling apparatus.

Arrangement of the engaging and engaged sections at the corners of the heat sink and fan casing in the illustrated embodiment prevents dimensions of the heat sink and fan casing from being excessively increased. The word "corner" used herein indicates a region defined by connection or converging of two substantial sides as well as an intersection therebetween.

Also, in the illustrated embodiment, the second engagement structure is constructed in the manner that the second and third engaging sections engage with the second and third engaged sections while interposing them therebetween. Such construction permits an operation for engagement between the first engaging section and the first engaged section and that between the second engaging section and the second engaged section to be smoothly carried out without any interference. More particularly, a direction in which the first engagement element of the first engagement structure is moved is rendered different from that in which the second and third engagement elements of the second engagement structure are moved, to thereby prevent the engagement elements from interfering with each other during the movement. Thus, assembling of the electronic component cooling apparatus is further facilitated.

The illustrated embodiment is directed to connection of the connection terminals T1 to T3 to the external circuit without using any connector. However, the present invention is not limited to such connection.

Referring now to FIGS. 8A to 10, another embodiment of an electronic component cooling apparatus according to the present invention is illustrated, which is substantially the same manner as the embodiment described above with reference to FIGS. 1A to 7, except that a connector structure is provided. In FIGS. 8A to 10, parts corresponding to those in FIGS. 1A to 7 are designated by reference characters represented by adding numeral "100" to reference characters used for indicating the corresponding parts in FIGS. 1A to 7.

In the embodiment of FIGS. 8A to 10, a terminal holder 151 includes a terminal holding section 167 which is constructed so as to linearly lead out three connection terminals T1 to T3 therefrom. The terminal holding section 167 may be constructed in substantially the same manner as a housing of a female connector in which a male connector is fitted. The remaining part of the embodiment of FIGS. 8A to 10 may be constructed in substantially the same manner as the above-described embodiment.

In the embodiments described above, the engagement elements 69, 71 and 169, 171 constituting the second and third engagement elements are integrally provided on the terminal holding sections 67 and 167 of the terminal holders 51 and 151, respectively. The present invention is not limited to such arrangement wherein a pair of the engagement elements are provided on the terminal holder. The engagement elements may be fixed directly to the casing body of the casing. In this instance, the engagement elements may be formed integrally with the casing body. The integral formation may be carried out in a manner to decrease a thickness of the engagement elements or increase a length thereof, to thereby provide the engagement elements with flexibility.

Referring now to FIGS. 11A to 13B, a further embodiment of an electronic component cooling apparatus according to the present invention is illustrated, wherein first and second engagement structures each are constructed in the form of a manual engagement release structure. In FIGS. 11A to 13B, parts corresponding to those in FIGS. 1A to 7 are designated by reference characters represented by adding numeral "200" to reference characters used for indicating the corresponding parts in FIGS. 1A to 7. First and second engagement elements 248 and 268 are connected at an intermediate portion thereof through connection sections 284 to a pair of corners 239 and 235 defined opposite to each other on a base section 235 of a casing body 234. The first and second engagement elements 248 and 268 are provided at a lower end thereof facing a heat sink 203 with hooks 248a and 268a each constituting an engaging section, respectively. Also, the first and second engagement elements 248 and 268 have upper ends 248b and 268b operated by two fingers such as a combination of the thumb and middle finger, respectively. The upper ends 248b and 268b are formed into a configuration and dimensions sufficient to permit force required for approaching them to each other to be readily applied thereto.

The opposite corners 239 and 235 of the base section 235 of the casing body 239 and 253 each are provided with a pair of contact elements 286 in a manner to be positioned on both sides of each of the first and second engagement elements 248 and 268. The contact elements 286 are arranged so as to downwardly extend from the base section 235. When a fan 201 is kept mounted on the heat sink 203, the contact elements 286 are kept contacted with an outer end surface of radiation fins as shown in FIG. 11B. Arrangement of the contact elements 286 in such a manner as described above permits the contact elements 286 to prevent movement of a casing 233 even when the engagement elements 248 and 268 are moved in the same direction or directions opposite to each other. This effectively prevents positioning of the casing 233 from being rendered troublesome due to movement of the engagement elements 248 and 268 or the hooks 248a and 268a from being readily released from engaged sections.

The heat sink 203, as shown in FIGS. 12A to 13B, has a pair of corners 203B and 203G opposite to each other cut out, each of which is formed with a rising section 203D, so that the corners each are formed at a lower end thereof with a step 203E. The steps 203E are engaged with the hooks 248a and 268a of the engagement elements 248 and 268, respectively. The step 203E of the corner 203B constitutes a first engaged section extending perpendicular to a phantom line L21 defined so as to outwardly extend from a center C of the heat sink 203 through the corner 203B. The step 203E of the corner 203G constitutes a second engaged section extending perpendicular to a phantom line L22 defined so as to outwardly extend from the center C of the heat sink 203 through the corner 203G.

The corners 203B and 203G thus cut out each are integrally formed with a pair of guide projections 203F1 and 203F2. The guide projections 203F1 and 203F2 are arranged on both sides of the rising portion 203D so as to extend in parallel to each of the phantom lines L21 and L22 and then upwardly project. The guide projections 203F1 and 203F2 are spaced from each other at an interval sufficient to permit the hooks 248a and 268a of the engagement elements 248 and 268 of the casing 233 to pass therebetween but prevent lateral movement of the hooks 248a and 268a. The guide projections 3F1 and 3F2 each have a tapered upper guide surface which is inwardly curved.

Figure 11A:
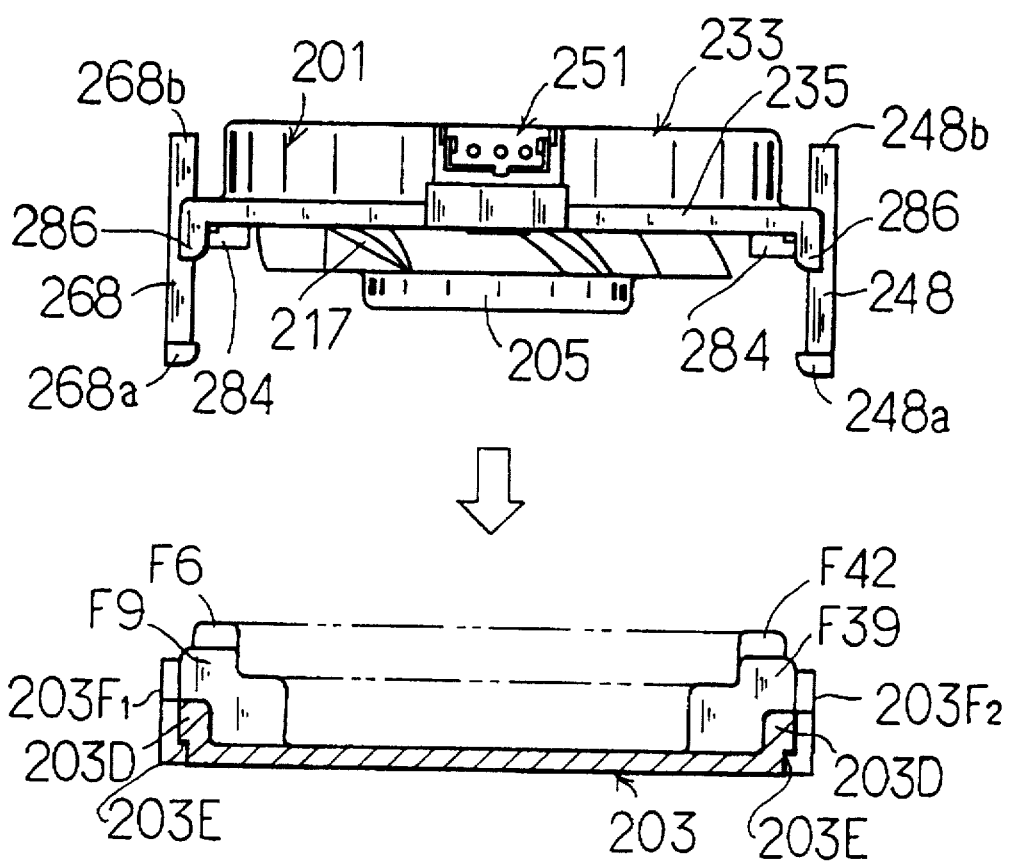
FIG. 11A is an exploded sectional view showing a further embodiment of an electronic component cooling apparatus according to the present invention.
Figure 11B:
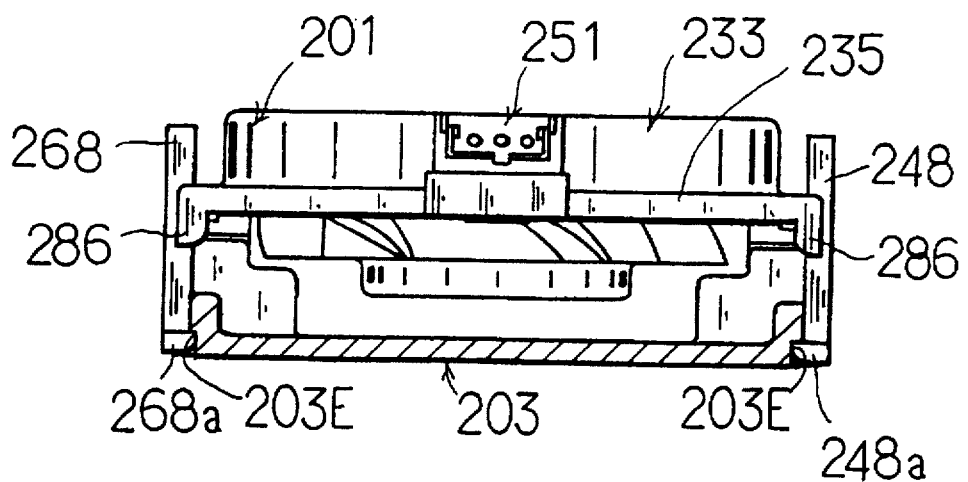
FIG. 11B is a side elevation view partly in section of the electronic component cooling apparatus shown in FIG. 11A.
Figure 12A:
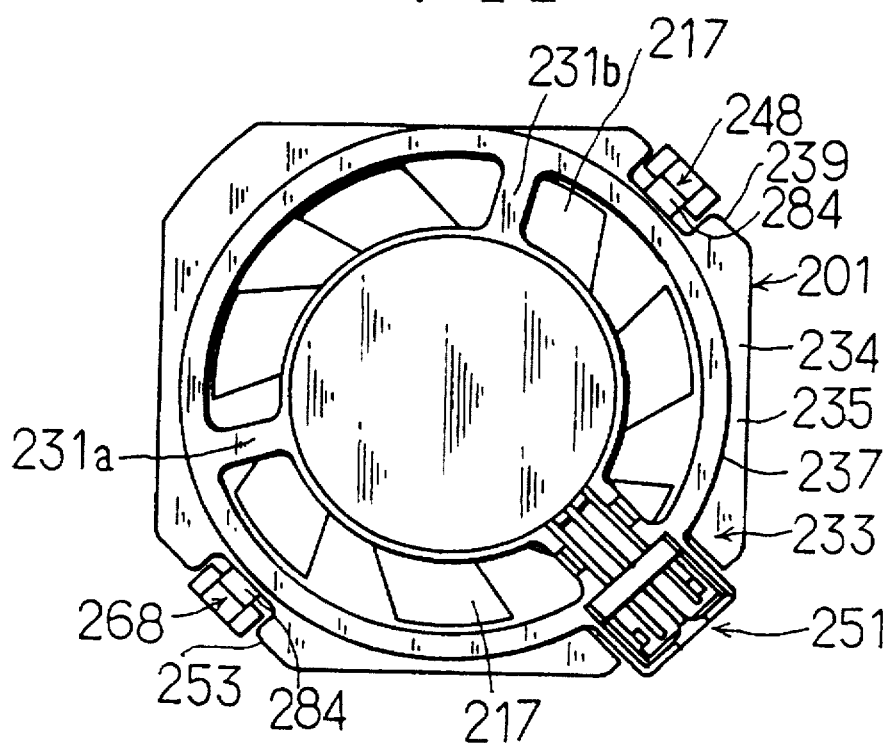
FIG. 12A is a plan view showing a fan.
Figure 12B:
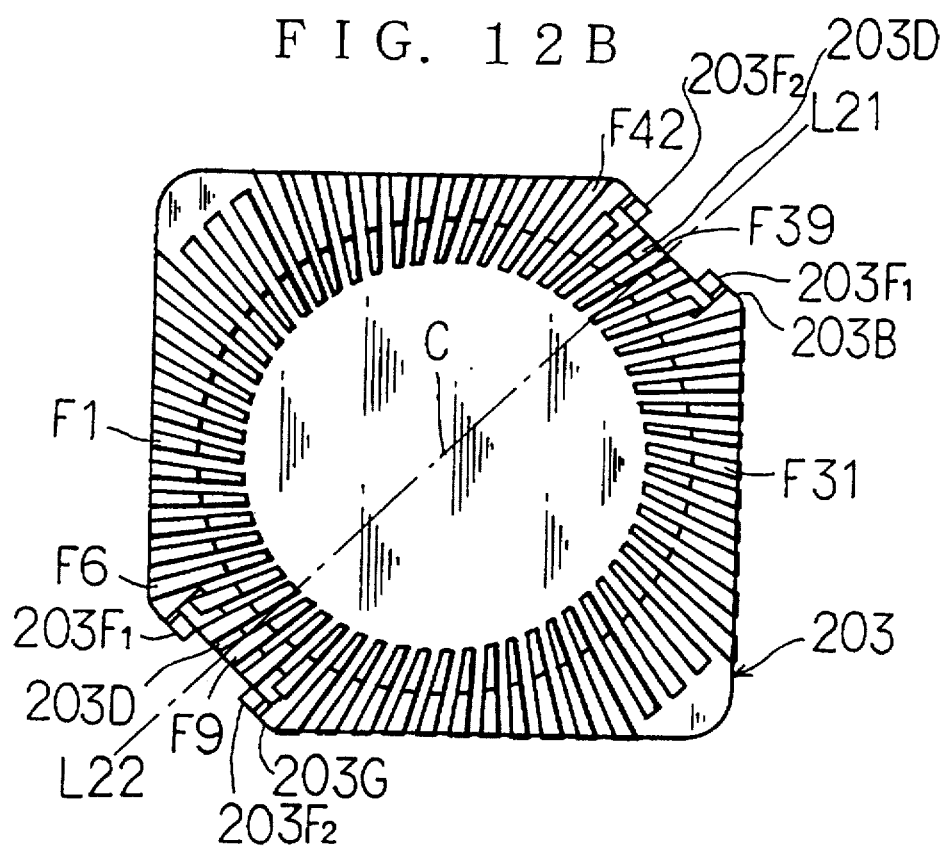
FIG. 12B is a plan view showing a heat sink.

Connection of the fan 201 to the heat sink 203, as shown in FIG. 11A, is carried out by linearly moving the fan 201 toward the heat sink 203. Separation or disconnection of both from each other is carried out by holding the upper ends 248b and 268b of the engagement elements 248 and 268 between two fingers to approach them to each other, to thereby release the hooks 248a and 268a from engagement with the steps 203E and then upwardly pulling the fan 201. Thus, the separation is highly facilitated.

Referring now to FIGS. 14A and 14B, a further embodiment of an electronic component cooling apparatus according to the present invention is illustrated, wherein first and second engagement structures each are likewise constructed in the form of a manual engagement release structure. In FIGS. 14A and 14B, parts corresponding to those in FIGS. 1A to 7 are designated by reference characters represented by adding numeral "300" to reference characters used for indicating the corresponding parts in FIGS. 1A to 7. The embodiment of FIGS. 14A and 14B are substantially different from the embodiment of FIGS. 11A to 13B in that first and second engagement elements 348 and 368 each are free of an upper end for manual operation and first and second engaged sections of a heat sink each comprise a step 303H provided in the middle of a through-hole 303G. Arrangement of the first and second engagement elements 348 and 368 at corners of a casing 333 opposite to each other and arrangement of the first and second engaged sections at corners of a heat sink 303 opposite to each other are made in substantially the same manner as in the above-described embodiments.

In the illustrated embodiment, hooks 348a and 368a provided on the first and second engagement elements 348 and 368 so as to provide engaging sections are arranged in a manner to extend in directions apart from each other. The through-hole 303G has a small-diameter section arranged on a side thereof into which the engagement elements is inserted and tapered so as to be inwardly inclined. Also, the through-hole 303G has a large-diameter section formed in a manner to be contiguous to the small-diameter section and formed into a diameter larger than the small-diameter section. The steps 303H constituting the first and second engaged sections each are arranged between the small-diameter section and the large-diameter section.

Connection of a fan 301 to the heat sink 303, as shown in FIG. 14A, is carried out by linearly moving the fan 301 toward the heat sink 303. Separation of both from each other is carried out by holding the upper ends of the engagement elements 348 and 368 between two fingers to approach them to each other, to thereby release the hooks 348*a* and 368*a* from engagement with the steps 303H and then upwardly pulling the fan 301.

As can be seen from the foregoing, the electronic component cooling apparatus of the present invention is so constructed that the heat sink is connected to the fan casing by means of the engagement connection structure. Thus, the connection is carried out without any specific mounting means such as screws or the like. Also, in the present invention, the engagement connection structure may be so constructed that at least one of the heat sink and fan is linearly moved with respect to the other, to thereby complete connection therebetween. Such construction highly facilitates assembling of the apparatus. In particular, at least one of the first and second engagement structures is constructed in the form of the manual engagement release structure which permits the casing to be manually released from engagement with the heat sink without rotating both relatively to each other. This permits the fan to be readily removed from the heat sink.

While preferred embodiment of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed:

1. An electronic component cooling apparatus comprising:

a fan including a motor having a rotor and a housing, an impeller having a plurality of blades and fixed on said rotor of said motor, a casing having a casing body, and a plurality of webs for interconnecting said housing of said motor and said casing;

a heat sink including a base and a plurality of radiation fins arranged on an upper surface of said base and connected to a lower section of said casing of said fan; and an engagement connection structure for connecting said heat sink to said casing of said fan;

said engagement connection structure including first and second engagement structures arranged opposite to each other with said fan being interposed therebetween and said first and second engagement structures being constructed so as to complete connection between said heat sink and said fan by linearly moving at least one of said heat sink and fan toward the other one thereof;

at least one of said first and second engagement structures comprising a manual engagement release structure for manually releasing engagement between said casing and said heat sink without rotating said casing and heat sink relatively to each other.

2. An electronic component cooling apparatus as defined in claim 1, wherein said manual engagement release structure comprises at least one engaging section provided on at least one engagement element arranged on said casing and at least one engaged section formed on said heat sink and engaged with said engaging section;

said engagement element being made of an insulating material exhibiting flexibility;

said engagement element being fixed at an intermediate portion thereof to said casing body of said casing and formed in to an elongate shape so as to vertically extend;

said engaging section being arranged on a lower end of said engagement element;

said engagement element having an upper end formed into a length sufficient to permit it to be operated by fingers.

3. An electronic component cooling apparatus as defined in claim 1, wherein said first engagement structure is constructed so as not to manually release the engagement and said second engagement structure comprises said manual engagement release structure;

said first engagement structure includes a first engaged section provided at said heat sink and a first engaging section formed at a first engagement element provided on said casing and engaged with said first engaged section; and said second engagement structure includes second and third engaged sections arranged at said has sink in a manner to extend in parallel to each other in a direction across a direction in which said first engaged section extends and second and third engaging sections arranged at second and third engagement elements provided on said casing and engaged with said second and third engaged sections while interposing said second and third engaged sections therebetween.

4. An electronic component cooling apparatus as defined in claim 3, wherein said second and third engagement elements are formed of insulating material exhibiting flexibility;

said second and third engagement elements are fixed at an intermediate portion thereof to said casing body of said casing and formed into an elongate shape so as to vertically extend;

said second and third engagement elements are provided at a lower end thereof with said second and third engaging sections, respectively; and said second and third engagement elements each have an upper end formed into a length sufficient to permit it to be operated by the fingers.

5. An electronic component cooling apparatus as defined in claim 1, further comprising a plurality of spacer means arranged between said casing of said fan and said heat sink;

said spacer means each upwardly bending said casing so as to downwardly project a portion of said casing corresponding to each of said first and, second engagement structures and upwardly project a central portion thereof when said first and second engagement structures are engaged.

6. An electronic component cooling apparatus as defined in claim 5, wherein said spacer means are fixed to at least one of said casing and heat sink.

7. An electronic component cooling apparatus comprising:

a fan including a motor of a rotor outside-rotation type having a rotor rotated outside a stator and a housing, an impeller having a plurality of blades and fixed on said rotor of said motor, a casing having a casing body and arranged so as to partially surround said impeller, and a plurality of webs for interconnecting said housing of said motor and said casing; and a heat sink including a base and a plurality of radiation fins arranged on an upper surface of said base and connected to a lower section of said casing of said fan;

said heat sink having a first corner formed with a first engaged section in a manner to extend in a direction across a first phantom line defined so as to extend from a center of said heat sink through said first corner;

said heat sink having a second corner positioned opposite to said first corner and formed with second and third engaged sections arranged at both sides of a second phantom line defined so as to extend from the center of said heat sink through said second corner and be arranged on both sides of said second phantom line;

said casing of said fan having a first corner provided with a first engagement element including a first engaging section engaged with said first engaged section of said heat sink;

said casing of said fan having a second corner arranged opposite to said first corner of said casing and provided with second and third engagement elements including second and third engaging sections engaged with said second and third engaged sections of said heat sink, respectively:

said second and third engagement elements being formed of an insulating material exhibiting flexibility;

said second and third engagement elements each being fixed at an intermediate portion thereof to said casing body of said casing and formed into an elongate shape so as to vertically extend;

said second and third engagement elements being provided at a lower end thereof with said second and third engaging sections, respectively;

said second and third engagement elements each having an upper end formed into a length sufficient to permit it to be operated by fingers.

8. An electronic component cooling apparatus as defined in claim 7, wherein said first engagement element includes a leg extending from said casing toward said heat sink and a projection for engagement integrally provided on a distal end of said leg and formed with said first engaging section;

said first corner of said heat sink is provided with a pair of guide projections;

said guide projections being arranged on both sides of said first phantom line so as to extend parallel to said first phantom line;

said guide projections being spaced from each other at an interval sufficient to permit said projection of said first engagement element to pass therethrough and prevent lateral movement of said projection of said first engagement element;

said first engaged section comprises a step formed between said guide projections; and said first engaging section is formed into a configuration which permits said first engaging section to be engaged with said step.

9. An electronic component cooling apparatus as defined in claim 8, wherein said second corner of said heat sink is integrally provided with two engaged projections;

said engaged projections being arranged on both sides of said second phantom line so as to extend parallel to said second phantom line;

said engaged projections having lower end surfaces acting as said second and third engaged section, respectively.

10. An electronic component cooling apparatus as defined in claim 9, wherein said second and third engaging sections comprise hooks integrally provided on an inner surface of said lower end of said second and third engagement elements so as to face each other respectively; and said engaged projections each are integrally provided a free end thereof with a guide projection in a manner to upwardly project therefrom;

said last mentioned guide projections having inclined surfaces obliquely formed so as to be contacted with said hooks of said second and third engagement elements to gradually increase an interval between said lower ends of said second and third engagement elements, respectively.

11. An electronic component cooling apparatus defined in claim 7, wherein said upper end of each of said second and third engagement elements is formed into a length sufficient to permit it to be operated by fingers.

12. An electronic component cooling apparatus as defined in claim 11, wherein said upper end of each of said second and third engagement elements is provided on an outer surface thereof with a non-slip means.

13. An electronic component cooling apparatus as defined in claim 7, further comprising a plurality of spacer means arranged between said casing of said fan add said heat sink;

said spacer means each upwardly bending said casing so as to downwardly project a portion of said casing on which said first engaging section is provided and a portion thereof on which said second and third engaging sections are provided and upwardly project a region of said casing between said portions of said casing when engagement between said first engaging section and said first engaged section and engagement between said second and third engaging sections and said second and third engaged sections are maintained.

14. An electronic component cooling apparatus as defined in claim 13 wherein said spacer means are formed integrally with said casing.

15. An electronic component cooling apparatus comprising:

a fan including a motor having a rotor and a housing, an impeller having a plurality of blades and fixed on said rotor of said motor, a casing having a casing body and arranged so as to surround said impeller, a plurality of webs for interconnecting said housing of said motor and said casing, a circuit board received in said housing and mounted thereon with at least a part of a control circuit for controlling said motor, and a plurality of connection terminals electrically connected at one end thereof to an electrode section provided on said circuit board and at the other end thereof to an external circuit;

a heat sink including a base and a plurality of radiation fins arranged on an upper surface of said base and connected to a lower section of said casing of said fan; and an engagement connection structure for connecting said heat sink to said casing of said fan;

said engagement connection structure including first and second engagement structures arranged opposite to each other with said fan being interposed therebetween;

at least one of said first and second engagement structures comprising a manual engagement release structure for manually releasing engagement between said casing and said heat sink without rotating said casing and heat sink relatively to each other;

said connection terminals being held in a terminal holder mounted on said casing body of said casing and made of an insulating resin material.

16. An electronic component cooling apparatus as defined in claim 15, wherein said connection terminals are received in said terminal holder while being kept bent into a substantially L shape;

said connection terminals each being provided at the other end thereof with a contact terminal section contacted with an electrode section of the external circuit;

said contact terminal section being formed so as to project from a lower end of said terminal holder.

17. An electronic component cooling apparatus as defined in claim 15 or 16, wherein said engagement connection structure includes a first sneaked section provided at a first corner of said heat sink in a manner to extend in a direction across a first phantom line defined so as to extend from a center of said heat sink through said first corner, second and third engaged sections provided at a second corner of said heat sink opposite to said first corner in a manner to extend parallel to a second phantom line defined so as to extend from the center of said heat sink through said second corner and be arranged on both sides of said second phantom line, a first engaging section provided on a first engagement element arranged at a first corner of said casing of said fan and engaged with said first engaged section of said heat sink, and second and third engaging sections provided on second and third engagement elements arranged at a second corner of said casing opposite to said first corner of said casing and engaged with said second and third engaged sections of said heat sink, respectively;

said second and third engagement elements being formed of a material exhibiting flexibility;

said second and third engagement elements each being fixed at an intermediate portion thereof to said casing body of said casing and formed into an elongate shape so as to vertically extend;

said second and third engagement elements being provided at a lower end thereof with said second and third engaging sections, respectively;

said second and third engagement elements each having an upper end formed into a length sufficient to permit it to be operated by fingers.

18. An electronic component cooling apparatus as defined in claim 17, wherein said terminal holder includes a terminal holding section for holding said connection terminals;

said first and second engagement elements being integrally formed on said terminal holder in a manner to be positioned on both sides of said terminal holding section.

19. An electronic component cooling apparatus as defined in claim 16, wherein a terminal holding section of said terminal holder is hollow and formed on a first side facing said casing body with a terminal inserting opening;

said terminal holding section is formed on a second side thereof opposite to said terminal inserting hole with a plurality of windows in a manner to positionally correspond to said connection terminals; and said connection terminals each are formed with a projection fitted in said window corresponding thereto.

20. An electronic component cooling apparatus as defined in claim 19, wherein said terminal holding section is formed on a lower portion thereof with a plurality of slits in each of which said contact terminal section of each of said connection terminals is movably fitted while being exposed.

21. An electronic component cooling apparatus as defined in claim 15, wherein said first and second engagement structures each comprise a manual engagement release structure; and said first and second engagement structures each include an engaging section provided on an engagement element arranged on said casing and an engaged section formed on said heat sink and engaged with said engaging section of said engagement element.

22. An electronic component cooling apparatus as defined in claim 21, wherein said engagement element is formed of an insulating material exhibiting flexibility;

said engagement element is fixed at an intermediate portion thereof to said casing body of said casing and formed into an elongate shape so as to vertically extend;

said engaging section is arranged on a lower end of said engagement element; and said engagement element has an upper end formed into a length sufficient to permit it to be operated by fingers.

23. An electronic component cooling apparatus as defined in claim 22, wherein said engaged section of said first engagement structure is provided at a first corner of said heat sink in a manner to extend in a direction across a first phantom line defined so as to extend from a center of said heat sink through said first corner; and said engaged section of said second engagement structure is provided at a second corner of said heat sink opposite to said first corner in a manner to extend in a direction across a second phantom line defined so as to extend from the center of said heat sink through said second corner and be arranged on either side of said second phantom line.

24. An electronic component cooling apparatus as defined in claim 23, wherein said corners of said heat sink each are provided with a pair of guide projections;

said guide projections being arranged on both sides of said phantom line corresponding to each of said corners in a manner to extend parallel to said phantom line;

said guide projections being spaced from each other at an interval sufficient to permit said engaging section of said engagement element to pass therethrough and prevent lateral movement of said engaging section.

25. An electronic component cooling apparatus as defined in claim 24, wherein said engaged section comprises a step formed between said guide projections; and said engaging section is formed into a configuration which permits said engaging section to be engaged with said step.

26. An electronic component cooling apparatus as defined in claim 22, wherein said casing includes a cylindrical section for surrounding said impeller and a base section provided on one end of said cylindrical section and contacted with an upper end of said radiation fins;

said base section of said casing being integrally provided on both sides of a portion thereof on which said engagement elements of said first and second engagement structures are mounted with a pair of contact elements contacted with an outer end surface of said radiation fins.

* * * * *

UNITED STATES PATENT AND TRADEMARK OFFICE
CERTIFICATE OF CORRECTION

PATENT NO. : 5,615,998
DATED : April 1, 1997
INVENTOR(S) : Nobumasa Kodama et al.

It is certified that error appears in the above-indentified patent and that said Letters Patent is hereby corrected as shown below:

Column 13, line 7, delete "Without" and insert --without--.

Column 18, line 5, delete "in to" and insert --into--;
Column 18, line 23, delete "has" and insert --heat--;
Column 18, line 50, delete "and," and insert --and--.

Column 20, line 4, after "provided" insert --at--;

Column 20, line 13, after "apparatus" insert --as--;
Column 20, line 23, delete "add" and insert --and--;
Column 20, line 35, delete "13" and insert --13,--.

Column 21, line 12, delete "sneaked" and insert --engaged--.

Signed and Sealed this

Nineteenth Day of August, 1997

Attest:

BRUCE LEHMAN

Attesting Officer

Commissioner of Patents and Trademarks